United States Patent [19]

Nottenburg et al.

[11] Patent Number: 4,751,201

[45] Date of Patent: Jun. 14, 1988

[54] PASSIVATION OF GALLIUM ARSENIDE DEVICES WITH SODIUM SULFIDE

[75] Inventors: Richard N. Nottenburg, New York, N.Y.; Claude J. Sandroff, Tinton Falls, N.J.

[73] Assignee: Bell Communications Research, Inc., Livingston, N.J.

[21] Appl. No.: 21,668

[22] Filed: Mar. 4, 1987

[51] Int. Cl.[4] .................. H01L 21/302; B05D 5/12; B32B 9/00
[52] U.S. Cl. .................. 437/225; 427/372.2; 427/430.1; 427/443.2; 428/688; 428/698; 428/699; 357/30; 437/235
[58] Field of Search .............. 428/698; 427/87, 419.7; 148/DIG. 56; 29/588, 590

[56] References Cited

U.S. PATENT DOCUMENTS

| | | | |
|---|---|---|---|
| 4,095,011 | 6/1978 | Hawrylo et al. | 428/469 |
| 4,354,198 | 10/1982 | Hodgson et al. | 357/16 |
| 4,447,469 | 5/1984 | Peters | 427/54.1 |
| 4,513,057 | 4/1985 | Peters | 428/698 |

Primary Examiner—Norman Morgenstern
Assistant Examiner—Margaret Burke
Attorney, Agent, or Firm—James W. Falk

[57] ABSTRACT

A method of passivating a gallium arsenide electronic device by depositing a sulfide film on a portion on the substrate to be passivated for providing an ideal interface layer wherein surface state density is substantially reduced. The resulting electrical performance of the device is significantly greater than similar devices which have not been subject to passivation. The device may be a heterojunction bipolar transistor, PIN diode or field effect transistor.

5 Claims, 5 Drawing Sheets

PASSIVATION OF GALLIUM ARSENIDE DEVICES WITH SODIUM SULFIDE

CROSS REFERENCE TO RELATED APPLICATION

This application is related to the concurrently filed and copending Gmitter-Sandroff-Yablonovitch U.S. patent application Ser. No. 021,667, assigned to the assignee of the present application.

BACKGROUND OF THE INVENTION

1. Field of the Invention

This invention relates to the surface passivation of electronic devices implemented in III-V type semiconductors and particularly to the passivation of electronic devices implemented in gallium arsenide.

2. Description of the Prior Art

Gallium arsenide and other III-V type semiconductors are attractive candidate materials for the fabrication of high performance semiconductor components. Although such materials offer the promise of high operational speed, they generally suffer from a susceptibility to environmental degradation. Silicon semiconductor surfaces can be passivated by the development of a native oxide layer. However, attempts to surface passivate the III-V type semiconductors have not been entirely successful. The native oxide layers which can be formed on III-V compounds exhibit significant charge trapping under bias stress and, therefore, these native oxides are relatively ineffective as the surface passivation agent. In the case of gallium arsenide, growth of a native oxide layer leads to the formation of extrinsic defects yielding a high surface state density. In addition, most native III-V oxides are susceptible to environmental attack, for example, by moisture.

Known surface passivation methods for III-V compound semiconductors which are made typically of GaAs may be divided roughly into three types.

The first method utilizes deposited films such as $SiO_2$, $Si_3N_4$, $Al_2O_3$ and $P_2O_5$ which are known from their use as passivation films for the surfaces of silicon semiconductors. Such an approach has drawback that the deposition temperature is relatively high. $SiO_2$ film is most frequently used in view of the extensive practical knowledge concerning the deposition of such film in planar silicon semiconductor devices. However, $SiO_2$ films tend to take in Ga from the surface of a substrate made of GaAs or GaP, and as a result it will damage the stoichiometry of the surface of the substrate.

The second method is to form a native oxide film corresponding to a thermal oxidation film of silicon, in place of the deposited film suggested above. For example, the anodic oxidation method has the advantage that an insulating thin film can be formed at a markedly low temperature as compared with the deposition method and also with the thermal oxidation method, irrespective of the instances wherein a solution is used or a gas plasma is used. Conversely, however, this anodic oxidation method has the disadvantage that it is thermally unstable, and therefore, it has the drawback that the quality of the film will change substantially at a temperature below the temperature range adopted for thermal diffusion of impurities and post-ion implantation annealing. Furthermore, the interface between an anodic oxide film and a substrate made of GaAs or GaP tends to contain a number of defects, so that when this film is utilized as an insulating film of IG-FET (insulated - gate field effect transistor), there still cannot be obtained as yet a large value of surface mobility comparable with that within the bulk, and thus at the current technical stage, it is not possible for the anodic oxide film to fully display those advantages and features on applying it to the surface of GaAs and GaP substrates which are represented by high mobility as compared with a silicon substrate. In III-V semiconductors which essentially are binary compounds, a direct thermal oxidation of their surfaces has not yet produced any satisfactory results with respect to the quality of the film produced or to the state of interface. Such native oxide film has the further drawback that it is dissolved in acids such as HF, HCl, and $H_2SO_4$. Therefore, native oxide films inconveniently cannot be used in such manufacturing process as would comprise a number of steps.

The third approach is to perform chemical oxidation by the use of, for example, hot hydrogen peroxide solution. This method is entailed by limitation in the thickness of the oxide film which is formed, and accordingly the extent of application of this method is limited also.

U.S. Pat. No. 4,320,178 describes the use of an $A^{III} B^V$ sulfide for passivating an $A^{III} B^V$ semiconductor substrate, such as GaAs. The process for forming the sulfide utilizes heating the substate with sulfur or hydrogen sulfide. The use of hydrogen sulfide gas to modify the surface properties of gallium arsenide is also known from J. Massies et al., "Monocrystalline Aluminum Ohmic Contact to n-GaAs by $H_2S$ Adsorption", Appl. Phys. Lett., 38, (9), May 1, 1981, pp. 693–695, and J. Massies et al., J. Vac. Sci. Technol., 17, 1134 (1980). However, such surface modifications do not result in a passivation which is acceptable for opto-electronic devices.

U.S. Pat. No. 4,632,886 describes the use of an electrolyte solution of sulfide ions to provide a passivation layer on mercury cadmium telluride semiconductor substrates. The description is limited to a discussion of that specific compound semiconductor, and the passivation layer is described as being mercury sulfide, cadmium sulfide, and tellurium sulfide. Passivation of gallium arsenide in the same manner is not suggested, and to the contrary is still described as being obtained "by the formation of thermal oxides or nitrides."

Prior to the present invention there has not been a simple, easily implemented surface passivation technique for use in connection with electronic devices implemented in gallium arsenide and other III-V compounds which has been shown to achieve a sufficiently low surface recombination velocity and superior device operational characteristics.

SUMMARY OF THE INVENTION

Briefly, and in general terms, the present invention provides a method of passivating gallium arsenide electronic device by providing a gallium arsenide substrate; forming an electronic device on the surface of said substrate; and depositing a sulfide film on a portion of the substrate to be passivated. The sulfide film provides an ideal passivating interfacial layer in which surface state density is substantially reduced, thereby resulting in improved electrical performance and the ability to fabricate a wide variety of electro-optical and electronic devices.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENT

Figure 1A:
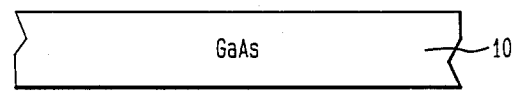
FIGS. 1a through 1g are cross-sectional views of a composite during successive steps of fabrication of an electronic device according to the present invention.

Referring to FIG. 1, there is shown a sequence of cross-sectional views of a bipolar transistor fabricated in gallium arsenide according to the present invention. FIG. 1a illustrates a gallium arsenide (GaAs) substrate 10 typically of semi-insulating conductivity. Although GaAs is used when referring to the material of the structure, it is understood that any binary III-V compound could be used. The substrate 10 may have a thickness of about 15 mils. It should be evident to those skilled in the art that the semiconductor regions shown to be of one type conductivity in the drawing can be substituted by semiconductor regions of the opposite conductivity, if desired, in order to produce a PNP transistor structure rather than the NPN transistor structure illustrated in the drawing.

Figure 1B:
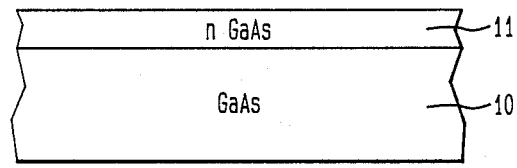

In FIG. 1b, a n-GaAs layer 11 is epitaxially grown on semi-insulating substrate 10 to serve as either a collector or emitter of an NPN transistor. Although any of several growth techniques may be used for the layers described herein, metal organic chemical vapor deposition (MOCVD) is preferred. MOCVD involves the use of selected molecular species for condensation on a heated substrate. Due to the relatively slow growth rate and low substrate temperature, very precise epilayer thickness and abrupt doping profiles can be obtained. Preferably, the n-type region 11 has a thickness of about 0.5 microns and an impurity concentration of approximately $5*10^{16}$ to $10^{18}$ impurities per cubic centimeter of GaAs. The n-type dopant used in epitaxial layer 11 may be either silicon, selenium or a similar n-type dopant.

Figure 1C:
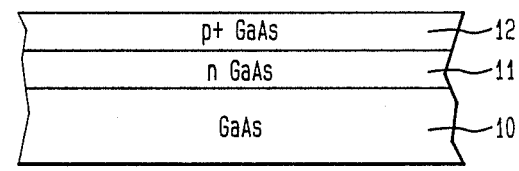

In FIG. 1c, a p-type layer 12 of gallium arsenide is epitaxially grown on n-layer 11 and serves as a base of the transistor. The layer 12 preferably has an impurity concentration of $10^{18}$ to $10^{20}$ impurities per cubic centimeter of GaAs. The layer 12 may have a thickness of 0.05-0.5 microns and would contain a p-type dopant such as beryllium.

Figure 1D:
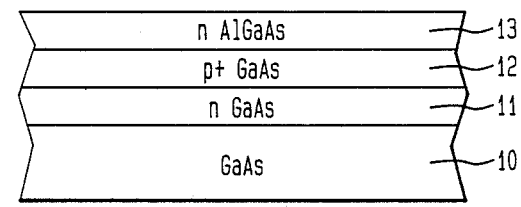

In FIG. 1d, a N-type layer 13 of aluminum gallium arsenide (AlGaAs) is epitaxially grown on p-type layer 12. (A capital "N" is used to denote the conductivity of a wider band gap material.) Preferably, N-layer 13 has a thickness of about 0.3-1.0 microns and an impurity concentration of approximately $10^{16}$ to $10^{18}$ per cubic centimeters of GaAs. In a bipolar transistor embodiment of the present invention, N-type layer 13 serves as the emitter.

Figure 1E:
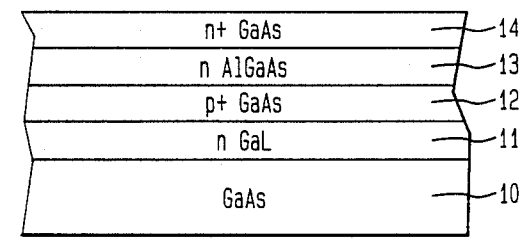

In FIG. 1e, a heavily doped (impurity concentration greater than $10^{18}$) epitaxial layer 14 of n+ GaAs is grown on the N-type layer 13 and a thickness of 0.1 to 0.5 microns.

Figure 1F:
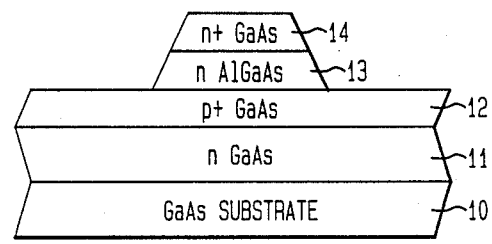

In FIG. 1f, the heavily-doped layer 14 and the N-type layer 13 are etched down to the p+ base layer 12 according to techniques known in the art.

Figure 1G:
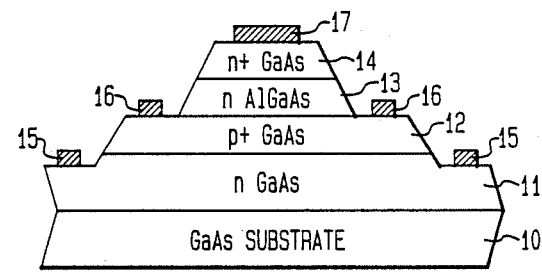
Figure 5A:
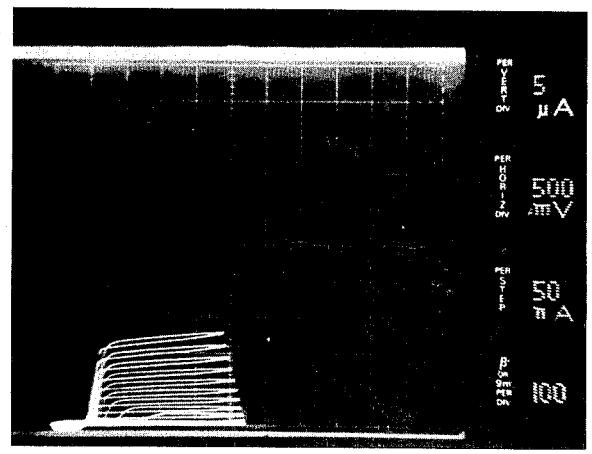
FIG. 5a is a graph of current and voltage characteristic of a test transistor structure in the emitter grounded configuration prior to application of the passivation technique and, FIG. 5b is a graph of the current and voltage characteristic of the same structure after application of the passivation technique according to the present invention.

In FIG. 1g, alloyed metal contacts 15, 16 and 17 are deposited on the layers 11, 12 and 17 respectively, forming contacts to the emitter, base and collector regions of the bipolar transistor device. The alloyed metal contacts are suitably chosen to form an ohmic connection to the semiconductor layer. At this point the device characteristics, and in particular the transistor common emitter gain, can be measured under various bias conditions. The result of such measurements for the device at such stage in processing is shown in FIG. 5a.

Figure 1H:
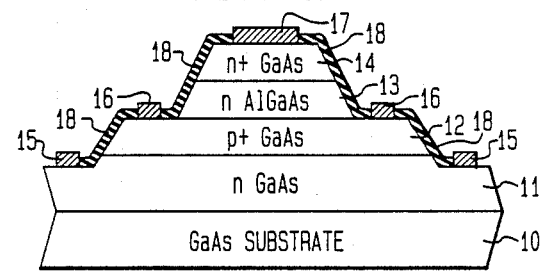
Figure 5B:
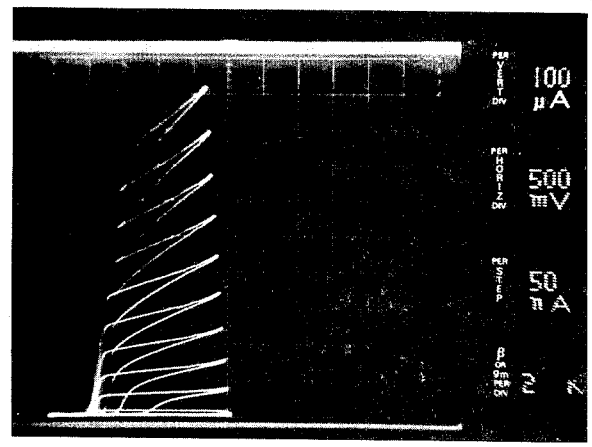

In FIG. 1h, the device is further processed according to the present invention. A passivating film 18 is spin deposited on the substrate from solution. In addition to spin coating, other deposition methods such as dip coating or roller coating may be used depending on fabrication requirements. In general, the film 18 covers the entire substrate, except for the ohmic contact regions. The passivating influence of the film affects the active junction, such as the emitter/base junction periphery of layers 11 and 12. The result of measurements of the device I-V characteristic of the transistor in the same configuration as FIG. 5a, at this stage is shown in FIG. 5b.

Figure 2:
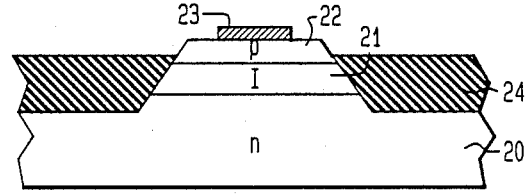
FIG. 2 is a cross-sectional view of another embodiment of the present invention in the form of a PIN photodiode.

In FIG. 2, another embodiment of the present invention is shown as a PIN diode. The passivating film 24 according to the present invention is deposited onto the active regions 20, 21, and 22 of the PIN photodiode according to the same techniques as described above. A contact 23 is provided to the p-region 22. Without passivation there is a sizable background current measured in the device due to the generation of charge carriers at surface defects. This surface current can be reduced by the surface passivation scheme of the present invention allowing the device to be much more sensitive as a photodetector at low light levels.

Figure 3A:
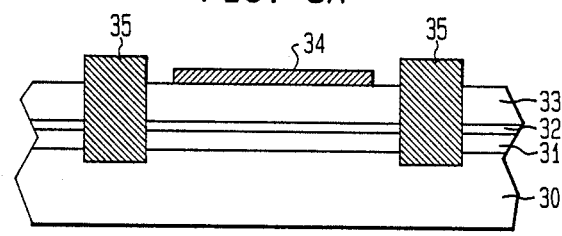
FIG. 3 is a cross-sectional view of another embodiment of the present invention including a metal-insulator-semiconductor structure.

In FIG. 3a, we illustrate another embodiment of the present invention that includes a graded insulator structure for fabricating high quality metal-insulator-semiconductor (MIS) structures. On a III-V substrate 30 a passivating film layer 31 is deposited of desired thickness. On film layer 31p a conventional insulator such as ($SiO_2$, or $Si_3N_4$, layer 33 is then deposited. A metal contact 34 is made to the insulator and similar contacts 35 are made to the semiconductor substrate 35. The presence of the passivating layer makes it possible to induce a current channel 31 between the film layer 31 and the III-V semiconductor substrate 30.

Figure 3B:
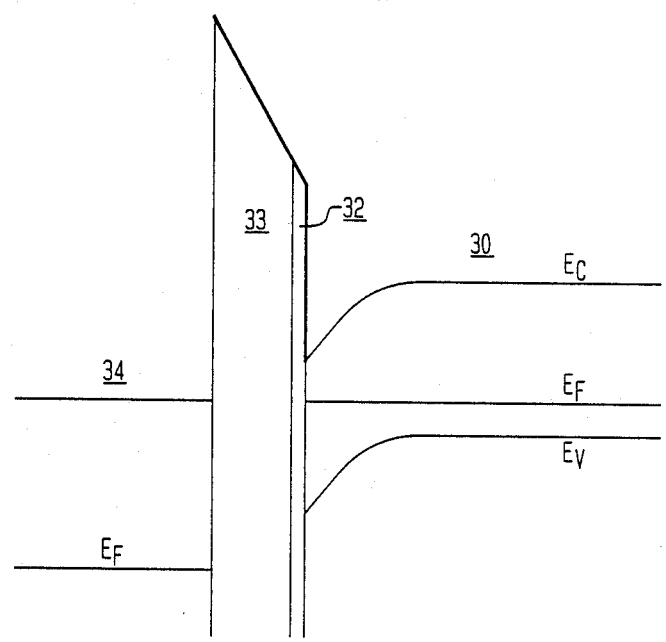

In FIG. 3b, the energy band diagram is provided for such a graded insulator structure shown in FIG. 3a. With no surface states existing with energies in the band gap the Fermi energy $E_F$ of the semiconductor is "unpinned". The reference numerals in FIG. 3b refer to the regions of the device shown in FIG. 3a.

Figure 4A:
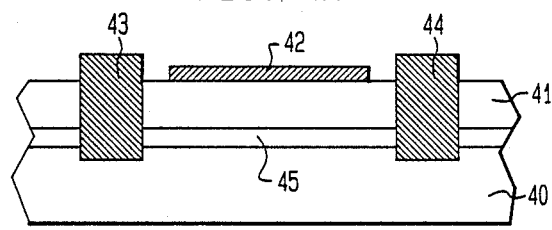
FIG. 4 is a cross-sectional view of another embodiment of the present invention including a metal-insulator-semiconductor field effect transistor.

In FIG. 4a, we illustrate another embodiment of the present invention in which a passivation film is incorporated into a MIS field-effect transistor (MISFET). The presence of a passivating film between a traditional insulator and the III-V compound induces the conducting channel necessary to obtain transistor action.

Figure 4B:
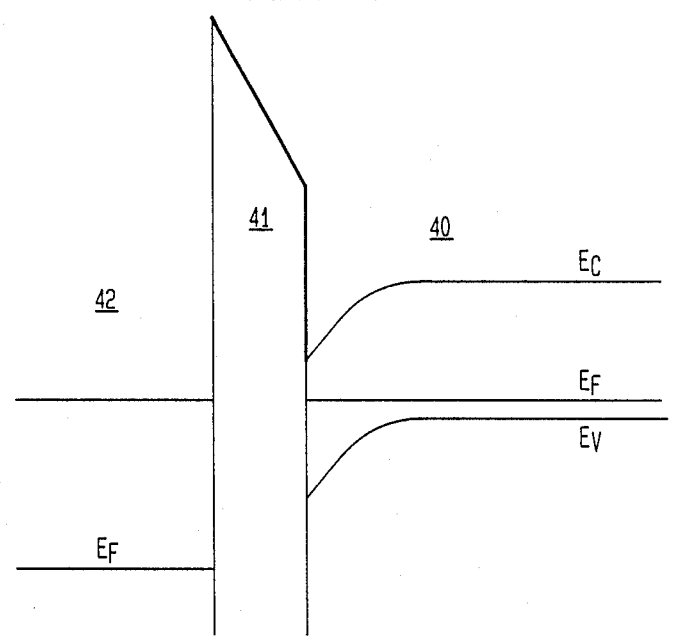

On a III-V substrate 40 a passivating film layer 45 is deposited of any desired thickness. On this film layer 45, a traditional insulator ($SiO_2$, $Si_3N_4$, layer 41 etc.) is deposited. A metal contact 42 is made to the insulator to act as a gate. Source and drain contacts 43 and 44 are made to the source and drain regions of the semiconductor substrate 40 using conventional techniques. Since the details of formation of such regions are known in the art, it is not necessary to describe it here. The presence of the passivating layer makes it possible to induce a current channel (not shown) between the film layer 31 and the III-V semiconductor substrate 40. In FIG. 4b, the energy band diagram corresponding to the MISFET of FIG. 4a is illustrated. An inversion layer is shown to exist (in this specific case electrons on the surface of p-type material) on the semiconductor surface. The reference numerals in FIG. 4b refer to the regions of the device shown in FIG. 4a.

The process for passivation of gallium arsenide electron devices can be described in greater detail at this point. It is well known that the free GaAs surface is plagued with both a large surface recombination velocity ($S \sim 10^6$ cm/sec) and a high surface state density ($N_s \sim 10^{12} cm^{-2}$). These characteristics impede the development of a metal-insulator-semiconductor technology, and limit the scale-down of minority carrier devices such as bipolar transistors. Though much progress has been made in understanding the poor electronic quality of the GaAs surface, prior to the present invention no completely successful scheme has been devised which passivates the GaAs interface both electronically and chemically while permitting the growth of an insulating barrier. The present invention provides a simple chemical treatment having favorable attributes as a passivation scheme for gallium arsenide devices, and III-V compound semiconductor device surfaces in general.

A heterostructure bipolar transistor (HBT) in accordance with our invention was grown by organometallic chemical vapor deposition. Mesa transistors were fabricated with emitter sizes of $50 \times 150$ $\mu m^2$, $40 \times 100$ $\mu m^2$, $18 \times 40$ $\mu m^2$ and $6 \times 20$ $\mu m^2$. In the device fabrication the emitter-base junction was first formed by sequential growth and removal of an anodic oxide. The base mesa was then defined using 5:1:1 $H_2SO_4:H_2O_2:H_2O$ and alloyed ohmic contacts were realized from evaporated Au/Ge and Au/Be.

The common-emitter characteristics for an as-processed (unpassivated) transistor are shown in FIG. 5a. A maximum differential current gain of $-3000$ is measured at a collector current of $I_C=18$ mA, corresponding to a collector current density of $720 A/cm^2$. The high current gain of these HBT devices is due to the long electron diffusion length in the base together with a defect-free emitter-base heterointerface. The current gain, $\beta$, for these transistors, however, was found to decrease markedly at low current levels and to depend on the perimeter-to-area (P/A) ratio of the emitter junction. These observations indicate that $\beta$, is limited primarily by the non-radiative recombination of minority carriers at the device perimeter as noted previously, for AlGaAs/GaAs HBT's. With the current gain so strongly dependent on the P/A ratio, these transistors are ideal tools for studying the effects of any surface recombination velocity at the emitter junction perimeter should increase $\beta$ particularly at low emitter junction bias.

In the passivating scheme, according to the present invention, fabricated device structures were first immersed in a mild etch (1:8:500 $H_2SO_4:H_2O_2:H_2O$) for 5 seconds and rinsed in distilled water. An aqueous solution of $Na_2S \cdot 9H_2O$ was then deposited on the device substrate which was spun at 5000 RPM for 60 seconds. A solution of other sulfides in aqueous or non-aqueous solutions can also be used, such as lithium sulfide, either as a replacement for, or in addition to, the treatment with sodium sulfide. This procedure left a colorless, crystalline film whose passivating effects persisted for several days. The film thickness varied substantially across a given substrate and was a sensitive function of the $Na_2S \cdot 9H_2O$ concentration in solution. In general we achieved the best results with $Na_2S \cdot 9H_2O$ solutions ranging in concentration from 0.5–1.0 M. At the high end of this concentration range it was sometimes found that a thick $Na_2S \cdot 9H_2O$ film covered the ohmic contacts of most of the devices. Under these circumstances no meaningful common-emitter characteristics could be obtained because of parallel conduction pathways in the ionic $Na_2S \cdot 9H_2O$ When such thick films were deposited, they were rinsed off in distilled water and $Na_2S \cdot 9H_2O$ was reapplied from a more dilute solution. The most substantial improvements in current gain were achieved when the entire emitter periphery was surrounded by the passivating film while the ohmic contacts remained uncovered.

In FIG. 5b, we compare the common-emitter characteristics at low base current for a transistor both before and after the sulfide treatment. The current gain for the untreated device in FIG. 5a is $\sim 30$. After a single passivation step, FIG. 5b reveals a more than 60-fold increase in $\beta$ to a value of about $\sim 2000$. To test if the effects of passivation could be reversed, the treated wafer was rinsed in distilled water and re-etched in 1:8:500 $H_2SO_4:H_2O_2:H_2O$. After this procedure, the current gain returned to its same initial low value of about $\sim 30$. The characteristic for the same transistor after the $Na_2S \cdot 9H_2O$ solution was reapplied appears similar to FIG. 5b. Not only does $\beta$ increase but the same high value is once again obtained. This sequence could be repeated indefinitely without any degradation in $\beta$ indicating that only the device interface is affected by the passivating process with no damage occurring to the bulk HBT structure.

The increase in $\beta$ associated with the passivation treatment is directly related to a decrease in surface recombination velocity. By neglecting the emitter hole diffusion current and assuming a base transport factor close to unity, we find that, where $i_n$ is the $$\beta = \frac{i_n}{i_s} \sim \left[\frac{V_n I_n}{S_o^2}\right]^{\frac{1}{2}} \frac{A_e}{P_e}^{\frac{1}{2}}$$

electron diffusion current, $i_s$ is the surface recombination current, $v_n$ is the electron diffusion velocity and $A_e$ and $P_e$ are the emitter junction area and perimeter, respectively. Thus, the increase in current gain by about $\sim 60$ due to the passivation process implies a decrease in $S_o$ by the same factor. Furthermore, one can achieve by passivation considerable device scale down since a treated transistor could have a P/A ratio smaller than an untreated one by a factor of $60^{\frac{1}{2}}$ while yielding the same current gain.

On the microscopic scale, the decrease of $S_o$ implies a significant reduction in the number of active non-radiative recombination centers on the device perimeter. We believe that the chemical reaction mechanism responsible for the passivation can be described by a two-step process where the native oxide and elemental arsenic are etched away exposing a pristine surface to which sulfur can strongly bond. Indeed, sulfur forms many stable binary compounds with both Ga and As; GaS and $As_2S_3$ for example, are well-known layered semiconductors, the latter having excellent glass forming properties. It is interesting to note that previous work conducted in high vacuum, and electrochemical environments, also concluded that a higher quality electronic interface resulted when GaAs was exposed to chalcogenide compounds.

For technological applications however, it would be convenient to be able to fabricate GaAs interfaces which not only possessed low surface state densities and low $S_o$'s but also remained stable in air for long periods of time. A recent photochemical procedure has gone far towards this goal showing that a relatively simple treatment could result in a lowering of $S_o$ persisting for several minutes. We have found that HBT structures electronically passivated by films of $Na_2S \cdot 9H_2O$ showed enhanced gain for several days after treatment. Besides offering the possibility of long term electronic passivation through the formation of sulfur bonds to the surface, $Na_2S \cdot 9H_2O$ films possess several other favorable materials properties. Its ionic nature permits easy removal by water rinse, and its high melting point ($\sim 920°$ C.) implies that films could be heated to high temperatures without any significant chemical degradation. To explore this idea, we submitted passivated HBT's to a thirty-minute heat treatment at 200° C. in a $N_2$ atmosphere. After rinsing off the bulk $Na_2S \cdot 9H_2O$ film we could still observe a significant degree of surface passivation, with $\beta$ factor of 3 to 10 greater than in the unpassivated devices. In terms of future opto-electronic devices, it seems plausible that conditions could be found under which a thin sulfided layer would be formed which would be fully passivating and chemically robust. On such an interface it might be possible to deposit thick insulating layers from which MIS devices could be fabricated.

The basic method of making semiconductor devices is to grow or deposit a sequence of semiconductor crystal layers with specific doping and chemical composition on the semiconductor substrate or wafer. A plurality of distinct electronic devices may then be implemented on a major surface of the semiconductor wafer utilizing portions of such layers as active semiconductor regions. The devices may vary in structure, size, shape, composition, and function, and the use of particular layers, structures, and devices in the description hereunder are merely illustrative. The types of devices that may be implemented on the substrate may comprise memory or storage cells, radiative cells (laser), photoconductive cells, or other active or passive electronic or electro-optic devices.

The geometry and interconnections of such devices can be defined by masking and etching according to techniques known in the art. Once such structures are defined on the wafer, the cleaving of the wafer into dice representing individual semiconductor circuits or lasers, and the provision of electrical contacts to each die or laser are well known to those skilled in the integrated circuit art.

Without further analysis, the foregoing will so fully reveal the gist of the present invention that others can readily adapt it for various applications without omitting features that from the standpoint of prior art, fairly constitutes essential characteristics of the generic or specific aspects of this invention, and, therefore, such adaptations should and are intended to be comprehended within the scope and range of equivalence of the following claims.

What is claimed is:

1. A method of fabricating a passivated gallium arsenide electronic device comprising the steps of:

providing a gallium arsenide substrate;

forming an electronic device on the surface of said substrate by forming a first layer of gallium arsenide material of a first conductivity type on said substrate; forming a second layer of gallium arsenide material having a second conductivity type on said first layer; forming a third layer of gallium arsenide material having a first conductivity type overlying said second layer; and providing ohmic electrical contacts to said second and third layers;

depositing a sodium sulfide film on said first, second, and third layers of semiconductor material except for said ohmic electrical contacts, said sodium sulfide film being deposited by application of an aqueous solution of sodium sulfide, thereby enhancing the current gain of the electronic device.

2. A method as defined in claim 1, wherein said sulfide film is applied by spin-on at 5000 RPM for 60 seconds.

3. A method as defined in claim 1 wherein the step of forming an electronic device comprises forming a heterostructure bipolar transistor.

4. An article of manufacture prepared by a process comprising the steps defined in claim 1.

5. A method of fabricating a passivated gallium arsenide PIN photodiode comprising the steps of providing a PIN diode gallium arsenide semiconductor device consisting of first, second, and third active regions;

providing an electrical contact to said third active region; and depositing a sodium sulfide film onto said first, second, and third active regions, except for said electrical contact, by application of an aqueous solution of sodium sulfide, said film functioning to reduce the background current in said photodiode due to generation of charge carriers at surface defects, thereby allowing the photodiode to be more sensitive at low light levels.

* * * * *